(12) United States Patent
Mogi et al.

(10) Patent No.: US 6,272,002 B1
(45) Date of Patent: Aug. 7, 2001

(54) ELECTROSTATIC HOLDING APPARATUS AND METHOD OF PRODUCING THE SAME

(75) Inventors: Hiroshi Mogi; Toshimi Kobayashi, both of Gunma-ken (JP)

(73) Assignee: Shin-Estu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/204,397

(22) Filed: Dec. 2, 1998

(30) Foreign Application Priority Data

Dec. 3, 1997 (JP) .................................................... 9-348531

(51) Int. Cl.⁷ .................................................. H02N 13/00
(52) U.S. Cl. ............................................. 361/234; 279/128
(58) Field of Search .................................. 361/233–235; 279/128

(56) References Cited

U.S. PATENT DOCUMENTS

| | | | |
|---|---|---|---|
| 5,151,845 | * 9/1992 | Watanabe et al. | 361/234 |
| 5,155,652 | * 10/1992 | Logan et al. | 361/234 |
| 5,191,506 | * 3/1993 | Logan et al. | 361/234 |
| 5,207,437 | * 5/1993 | Barnes et al. | 361/234 |
| 5,606,484 | * 2/1997 | Kawada et al. | 361/234 |
| 5,663,865 | * 9/1997 | Kawada et al. | 361/234 |

FOREIGN PATENT DOCUMENTS

408316299A * 11/1996 (JP) .
409082788A * 3/1997 (JP) .

* cited by examiner

*Primary Examiner*—Fritz Fleming
(74) *Attorney, Agent, or Firm*—Hogan & Hartson, LLP

(57) ABSTRACT

There is disclosed an electrostatic holding apparatus in which a voltage is applied to an electrode formed of a conductive layer disposed on an insulator layer and covered with an insulating dielectric layer in order to cause the insulating dielectric layer to electrostatically attract an object. The electrostatic holding apparatus is formed of a sintered body in which a thermal expansion mitigating layer is disposed between the insulating dielectric layer and the conductive layer and/or between the conductive layer and the insulator layer. The insulating dielectric layer, the conductive layer, the insulator layer, and the thermal expansion mitigating layer are superposed and press-formed in an unfired state to obtain a green body, which is then sintered to obtain the sintered body. An insulating dielectric layer, a conductive layer and an insulator layer are united while differences in coefficient of thermal expansion among these layers are minimized in order to prevent generation of inter-layer delamination, cracks, and the like, and in order to prevent generation of distortion or warping on the electrostatic attraction surface to thereby increase the electrostatic attraction force. Further, the electrostatic holding apparatus has an excellent capability of allowing removal of an object at the time of stopping application of voltage and an increased withstand voltage.

6 Claims, 1 Drawing Sheet

ELECTROSTATIC HOLDING APPARATUS AND METHOD OF PRODUCING THE SAME

BACKGROUND OF THE INVENTION

1. Field of the Invention

The present invention relates to an electrostatic holding apparatus, and more particularly to an electrostatic holding apparatus useful for a process performed during fabrication of semiconductor devices, liquid-crystal devices, etc., which apparatus can strongly attract and hold a conductive, semiconductive, or insulating object by means of electrostatic force at any temperature ranging from a low temperature to a high temperature, and which enables easy attachment/detachment of the object. The present invention also relates to a method of producing such an electrostatic holding apparatus.

2. Description of the Related Art

Recently, processes for fabricating semiconductor devices, liquid-crystal devices, etc.; especially processes of drying etching, ion implantation, and vapor deposition, have become more and more automated and performed as dry processes. Under such circumstances, the number of fabrication processes performed under vacuum has increased.

Meanwhile, positional accuracy at the time of patterning has become more important, since the diameters of silicon wafers and glass plates serving as substrates have increased and the degree of integration of circuits and the degree of fineness of patterns have increased. Therefore, vacuum chucks have conventionally been used to transport wafers or to attract and fix wafers. However, vacuum chucks have the following drawbacks. Vacuum chucks cannot be used under a vacuum environment because of impossibility of creating a pressure difference. Although vacuum chucks can be used under a low-vacuum environment, a wafer subjected to suction undergoes a local distortion because the wafer is subjected to suction locally, with the result that accurate positioning becomes difficult. Therefore, vacuum chucks are not suitable for recently developed processes for fabricating semiconductor devices and liquid-crystal devices.

Recently, as a device that has overcome the above-described drawbacks, there has been widely noticed and put into practical use an electrostatic holding apparatus which transports and/or attracts and fixes a wafer by means of electrostatic force. In a recent process for fabricating semiconductor devices and liquid-crystal devices, with an increase in the degree of fineness of devices, the flatness of wafers and glass plates serving as substrates has become more and more important. Therefore, employment of electrostatic holding apparatuses has been considered, with a view toward performing a straightening correction for improving the flatness of wafers and glass plates. Also, since many processes are performed in a high temperature, corrosive gas atmosphere, an electrostatic holding apparatus formed of ceramics has been developed.

Two methods for producing such a conventional ceramic electrostatic holding apparatus have been proposed. In the first method, through printing or a like process, a conductive layer is formed on a substrate (insulator layer) formed of sintered ceramics, on which an insulating dielectric layer is formed through thermal spraying. In the second method, an insulating dielectric layer (a sintered body comprising 99% alumina) is bonded onto a conductive layer through used of adhesive.

Further, in recent years, an electrostatic holding apparatus having improved durability has been proposed (see Japanese Patent No. 2129621). This electrostatic holding apparatus is produced as follows. A conductive layer is sandwiched between a green sheet for an insulating dielectric layer and a green sheet for an insulator layer, both formed through tape forming, casting, or press forming, and the layer and sheets are superposed in an unfired state so as to become united, and then fired to obtain a sintered body serving as the electrostatic holding apparatus.

However, the electrostatic holding apparatus produced in accordance with the above-described manner has problems in that the electrostatic attraction surface has distortion and/or warping that is conceivably generated due to differences in coefficient of thermal expansion among the three layers, and in that since inter-layer delamination, cracks, and the like are generated in the sintered body, a sufficient electrostatic attraction force cannot be obtained, and withstand voltage is low.

SUMMARY OF THE INVENTION

The present invention has been accomplished to solve the above-mentioned problems, and an object of the present invention is to provide an electrostatic holding apparatus, in which an insulating dielectric layer, a conductive layer and an insulator layer are united while differences in coefficient of thermal expansion among these layers are minimized in order to prevent generation of inter-layer delamination, cracks, and the like, and in order to prevent generation of distortion or warping on the electrostatic attraction surface to thereby increase the electrostatic attraction force; which does not suffer deterioration in the capability of allowing removal of an object at the time of stopping application of voltage; and which is excellent in terms of withstand voltage.

Another object of the present invention is to provide a method of producing such an electrostatic holding apparatus.

To achieve the above objects, the present invention provides an electrostatic holding apparatus in which a voltage is applied to an electrode formed of a conductive layer disposed on an insulator layer and covered with an insulating dielectric layer in order to cause the insulating dielectric layer to electrostatically attract an object, wherein the electrostatic holding apparatus is formed of a sintered body in which a thermal expansion mitigating layer is disposed between the insulating dielectric layer and the conductive layer and/or between the conductive layer and the insulator layer; and the insulating dielectric layer, the conductive layer, the insulator layer, and the thermal expansion mitigating layer are superposed and press-formed in an unfired state to obtain a green body, which is then sintered to obtain the sintered body.

When the electrostatic holding apparatus is formed of a sintered body in which a thermal expansion mitigating layer is disposed between the insulating dielectric layer and the conductive layer and/or between the conductive layer and the insulator layer; and the insulating dielectric layer, the conductive layer, the insulator layer, and the thermal expansion mitigating layer are superposed and press-formed in an unfired state to obtain a green body, which is then sintered to obtain the sintered body, the differences in coefficient of thermal expansion among adjacent layers decrease because of presence of the thermal expansion mitigating layer, so that the electrostatic holding apparatus thermally expands and contracts in substantially the same manner as does an electrostatic holding apparatus formed of a single layer. Therefore, almost no distortion or warping is generated on the surface of the insulating dielectric layer serving as an electrostatic attraction surface. Further, defects such as inter-layer delamination or cracks are hardly generated within the sintered body. Accordingly, the electrostatic holding apparatus produces a strong and uniform electrostatic attraction force with enhanced responsiveness, enables easy removal of an object, and has a high withstand voltage.

Preferably, the thermal expansion mitigating layer has a coefficient of thermal expansion between that of the conductive layer and that of the insulating dielectric layer and the insulator layer and is mainly formed of a ceramic material selected from the group consisting of aluminum nitride, aluminum oxide, silicon nitride, silicon oxide, zirconium oxide, titanium oxide, sialon, boron nitride, and silicon carbide, or a mixture of two or more kinds of ceramic materials selected from the group.

When the ceramic material of the thermal expansion mitigating layer is selected from the above-described group, the thermal expansion mitigating layer can be easily formed to have a coefficient of thermal expansion between that of the conductive layer and that of the insulating dielectric layer and the insulator layer. Further, the electrostatic holding apparatus is formed of a sintered body in which the thermal expansion mitigating layer having such a coefficient of thermal expansion is disposed between the insulating dielectric layer and the conductive layer and/or between the conductive layer and the insulator layer; and the insulating dielectric layer, the conductive layer, the insulator layer, and the thermal expansion mitigating layer are superposed and press-formed in an unfired state to obtain a green body, which is then sintered to obtain the sintered body.

Therefore, the differences in coefficient of thermal expansion among adjacent layers can be minimized, so that neither distortion nor warping is generated on the attraction surface of the electrostatic attraction portion after sintering, and defects such as inter-layer delamination or cracks are hardly generated within the sintered body. Thus, the electrostatic holding apparatus produces a strong and uniform electrostatic attraction force with enhanced responsiveness, and has a high withstand voltage. Accordingly, defects such as distortions and cracks are reliably prevented from being generated in a substrate (e.g., semiconductor wafer or glass plate) that is attracted and held by the electrostatic holding apparatus.

Preferably, each of the insulating dielectric layer and the insulator layer is mainly formed of a ceramic material selected from the group consisting of aluminum nitride, aluminum oxide, silicon nitride, silicon oxide, zirconium oxide, titanium oxide, sialon, boron nitride, and silicon carbide, or a mixture of two or more kinds of ceramic materials selected from the group.

As described above, the insulating dielectric layer and the insulator layer may be formed of the same material or different materials. However, the insulating dielectric layer and the insulator layer are preferably formed of materials that have similar coefficients of thermal expansion and that are easily sintered. Further, since the insulating dielectric layer serves an electrostatic attraction surface, the insulating dielectric layer is preferably formed of a material having a high dielectric constant.

The present invention also provides a method of producing an electrostatic holding apparatus in which a voltage is applied to an electrode formed of a conductive layer disposed on an insulator layer and covered with an insulating dielectric layer in order to cause the insulating dielectric layer to electrostatically attract an object. The production method comprises the steps of: superposing a green sheet for the insulator layer, a green sheet for the conductive electrode, a green sheet for the insulating dielectric layer, and at least one green sheet for the thermal expansion mitigating layer such that the thermal expansion mitigating layer is disposed between the insulating dielectric layer and the conductive layer and/or between the conductive layer and the insulator layer; press-forming the superposed layers to obtain a green body; and firing the green body to obtain a sintered body serving as the electrostatic holding apparatus.

When green sheets prepared for the respective layers are superposed and press-formed in order to unite them into a single body, which is then fired to obtain a sintered body serving as the electrostatic holding apparatus, almost no distortion or warping is generated on the attraction surface of the electrostatic attraction portion after sintering, and defects such as inter-layer delamination or cracks are hardly generated within the sintered body. Accordingly, there can be produced an electrostatic holding apparatus that produces a strong and uniform electrostatic force over the entire attraction surface.

The present invention further provides another method of producing an electrostatic holding apparatus in which a voltage is applied to an electrode formed of a conductive layer disposed on an insulator layer and covered with an insulating dielectric layer in order to cause the insulating dielectric layer to electrostatically attract an object. The production method comprising the steps of: covering a green sheet for the conductive layer and a green sheet for a thermal expansion mitigating layer with a green sheet for the insulating dielectric layer; superposing a green sheet for the insulator layer on the bottom surface of the green sheet for the thermal expansion mitigating layer; press-forming the thus superposed green sheets to obtain a green body; and firing the green body to obtain a sintered body serving as the electrostatic holding apparatus.

In this case, since the peripheral edge of the sintered body is covered with the insulating dielectric layer, no impurity is generated from the conductive layer, so that the electrostatic attraction characteristics and the withstand voltage can be improved.

As described above, in the electrostatic holding apparatus of the present invention, the at least one thermal expansion mitigating layer has a coefficient of thermal expansion between that of the conductive layer (electrodes) and that of the insulator layer and the insulating dielectric layer, which constitutes an electrostatic attraction portion for electrostatically attracting an object, and is disposed between the insulating dielectric layer and the conductive layer and/or between the conductive layer and the insulator layer. Green sheets for the above-described layers are superposed and united in an unfired state to form a green body, which is then sintered to obtain a sintered body serving as the electrostatic holding apparatus. Therefore, the electrostatic attraction portion does not suffer inter-layer delamination or cracks, which would otherwise be generated due to differences in coefficient of thermal expansion. Further, the sintered body itself does not cause warping, so that uniformity in the thickness of the dielectric layer is improved. Accordingly, the electrostatic holding apparatus produces a strong and uniform electrostatic attraction force with enhanced responsiveness. Further, since an amount of impurities is small, the electrostatic holding apparatus hardly damages semiconductor devices. Therefore, the electrostatic holding apparatus of the present invention has great industrial utility.

DESCRIPTION OF THE PREFERRED EMBODIMENT

Embodiments of the present invention will next be described in detail; however, the embodiments should not be construed as limiting the invention.

The inventors of the present invention considered that an electrostatic holding apparatus must have means for absorbing differences in coefficient of thermal expansion among an insulating dielectric layer, a conductive layer, and an insulator layer in order to prevent generation of distortion, warping, cracks, and the like in the attraction surface of an electrostatic attraction portion formed through integration of these layers and in order to prevent generation of inter-layer delamination and cracks within the electrostatic attraction portion, and found that when the electrostatic holding apparatus is formed of a sintered body in which a thermal expansion mitigating layer is disposed between the insulating dielectric layer and the conductive layer and/or between the conductive layer and the insulator layer, defects such as inter-layer delamination and cracks are not produced within the sintered body, and neither distortion nor warping is generated on the surface of the sintered body, thereby enabling production of a high-performance electrostatic holding apparatus that generates a strong electrostatic attraction force, enables smooth attachment and removal of an object, and has a high withstand voltage and a long service life. Based on this concept and through thorough investigation of other conditions, the present invention was completed.

Figure 1:
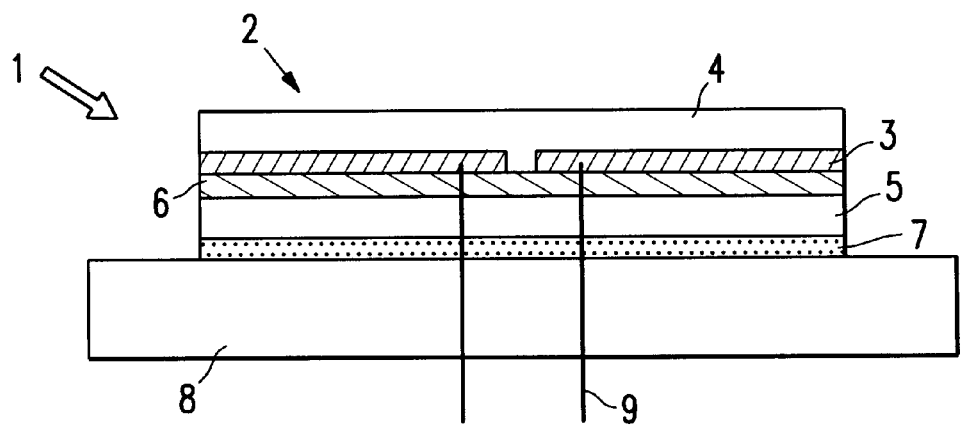
FIG. 1 is a vertical cross-sectional view showing an example of an electrostatic holding apparatus according to the present invention.

FIG. 1 shows a vertical cross-sectional view of an electrostatic holding apparatus 1 according to a first example of the present invention.

The electrostatic holding apparatus 1 includes an electrostatic attraction portion 2 bonded to the top surface of a plate portion 8 via an adhesive layer 7. The electrostatic attraction portion 2 has a plate-like structure such that a bipolar electrode 3 and a thermal expansion mitigating layer 6 are sandwiched between an insulating dielectric layer 4 and an insulator layer 5. When voltage from an external power supply is applied to the electrode 3 via lead wires 9, an electrostatic force is generated between the top surface of the electrostatic attraction portion 2 and an object (e.g., a semiconductor wafer) placed thereon. Thus, the object is held strongly, while straightening correction is performed to improve the flatness of the object.

Figure 2:
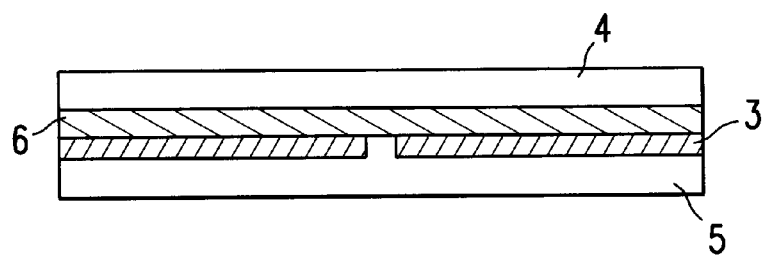
FIG. 2 is a vertical cross-sectional view showing a second example of an electrostatic holding apparatus according to the present invention.
Figure 3:
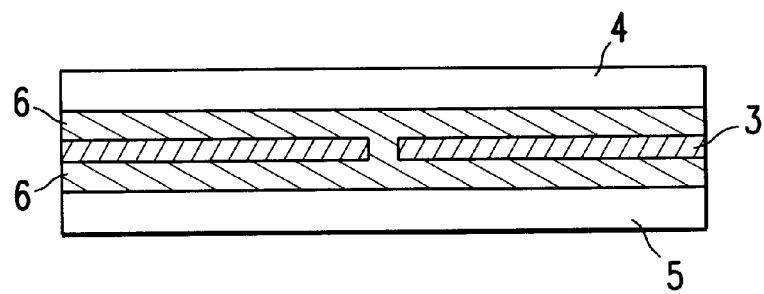
FIG. 3 is a vertical cross-sectional view showing a third example of an electrostatic holding apparatus according to the present invention.

In the present invention, the electrostatic attraction portion 2 is formed of a sintered body in which the thermal expansion mitigating layer 6 is disposed between the insulating dielectric layer 4 and the conductive layer 3 as shown in the examples of FIGS. 2 and 3 and/or between the conductive layer 3 and the insulator layer 5, as shown in the example of FIG. 1; these layers are superposed and process-formed in an unfired state in order to obtain a green body; and the green body is then fired to obtain the sintered body. In the electrostatic attraction portion 2 shown in the example of FIG. 1, the thermal expansion mitigating layer 6 is disposed between the conductive layer 3 and the insulator layer 5.

In the example of FIG. 1, the thermal expansion mitigating layer 6 is disposed between the insulator layer 5 and the conductive layer 3, whereas in the examples of FIGS. 2 and 3, the thermal expansion mitigating layer 6 is disposed between the insulator 5 and the conductive layer 3, as previously noted. In the example of FIG. 2, a single thermal expansion mitigating layer is disposed between the insulating dielectric layer 4 and the conductive layer 3, whereas in the example of FIG. 3, a second thermal expansion mitigating layer 6 is disposed between the conductive layer 3 and the insulator layer 5.

Since the electrostatic attraction portion 2 is formed of a sintered body in which the thermal expansion mitigating layer 6 is disposed between the insulating dielectric layer 4 and the conductive layer 3, in the example of FIGS. 2 and 3, and/or between the conductive layer 3 and the insulator layer 5, in the example of FIG. 1, which, together with the thermal expansion mitigating layer 6, are. superposed and press-formed into a green body to be sintered, the differences in coefficient of thermal expansion among adjacent layers decrease because of presence of the thermal expansion mitigating layer 6, so that the electrostatic holding apparatus thermally expands and contracts in substantially the same manner as does an electrostatic holding apparatus formed of a single layer. Therefore, almost no distortion or warping is generated on the surface of the insulating dielectric layer 4 serving as an electrostatic attraction surface. Further, defects such as inter-layer delamination or cracks are hardly generated within the sintered body. Accordingly, the electrostatic attraction portion 2 produces a strong and uniform electrostatic attraction force with enhanced responsiveness, enables easy removal of an object, and has a high withstand voltage.

Preferably, each of the insulating dielectric layer 4 and the insulator layer 5—which together constitute the electrostatic attraction portion 2—is formed mainly of a ceramic material selected from the group consisting of aluminum nitride, aluminum oxide, silicon nitride, silicon oxide, zirconium oxide, titanium oxide, sialon, boron nitride, and silicon carbide, or a mixture of two or more kinds of ceramic materials selected from the group.

As described above, the insulating dielectric layer 4 and the insulator layer 5 my be formed of the same material or different materials. However, the insulating dielectric layer 4 and the insulator layer 5 are preferably formed of materials that have similar coefficients of thermal expansion and that are easily sintered. Further, since the insulating dielectric layer 4 serves as an electrostatic attraction surface, the insulating dielectric layer 4 is preferably formed of a material that has a high dielectric constant and that does not serve as an impurity for an object such as a semiconductor wafer to be attracted.

The conductive layer 3—which constitutes the electrostatic attraction portion 2—is formed of a material selected from a group consisting of metals such as aluminum, iron, copper, silver, gold, titanium, tungsten, molybdenum, and platinum; and conductive ceramics such as graphite, carbon, silicon carbide, titanium nitride, and titanium carbide; or an alloy of two or more materials selected from the group; or a mixed sintered body of these materials. However, the insulating dielectric layer 4 and the insulator layer 5 are preferably formed of materials that have similar coefficients of thermal expansion.

Preferably, the thermal expansion mitigating layer 6—which is the most important feature of the present invention—has a coefficient of thermal expansion between that of the conductive layer 3 and that of the insulating dielectric layer 4 and the insulator layer 5, and is formed mainly of a ceramic material selected from the group consisting of aluminum nitride, aluminum oxide, silicon nitride, silicon oxide, zirconium oxide, titanium oxide, sialon, boron nitride, and silicon carbide; or a mixture of two or more kinds of ceramic materials selected from the group.

When the ceramic material of the thermal expansion mitigating layer is selected from the above-described group, the thermal expansion mitigating layer can be easily formed to have a coefficient of thermal expansion between that of the conductive layer 3 and that of the insulating dielectric layer 4 and the insulator layer 5. Further, the electrostatic holding apparatus is formed of a sintered body in which the thermal expansion mitigating layer having such a coefficient of thermal expansion is disposed between the insulating dielectric layer and the conductive layer as in the examples of FIGS. 2 and 3, and/or between the conductive layer and the insulator layer as in the example of FIG. 1; and the insulating dielectric layer, the conductive layer, the insulator layer, and the thermal expansion mitigating layer are superposed and press-formed in an unfired state to obtain a green body, which is then sintered to obtain the sintered body. Therefore, the differences in coefficient of thermal expansion among adjacent layers can be minimized, so that neither distortion nor warping is generated on the attraction surface of the electrostatic attraction portion after sintering, and defects such as inter-layer delamination or cracks are hardly generated within the sintered body. Thus, the electrostatic holding apparatus produces a strong and uniform electrostatic attraction force with enhanced responsiveness, and has a high withstand voltage. Accordingly, defects such as distortions and cracks are reliably prevented from being generated in a substrate (e.g., semiconductor wafer or glass plate) that is attracted and held by the electrostatic holding apparatus.

The coefficient of thermal expansion of the thermal expansion mitigating layer can be adjusted as follows. In the case of Invention Sample A shown in Table 1 where the insulating dielectric layer and the insulator layer were formed of alumina (coefficient of thermal expansion: 7.8×$10^{-6}$/° C.) and the conductive layer was formed of tungsten (coefficient of thermal expansion: 8.6×$10^{-6}$/° C.), the coefficient of thermal expansion of the thermal expansion mitigating layer was adjusted through addition, into alumina, of a few % of magnesium oxide, silicon oxide, or a mixture thereof, whose coefficient of thermal expansion is greater than that of alumina. In Invention Sample A, there was obtained a thermal expansion mitigating layer having a coefficient of thermal expansion of 8.2×$10^{-6}$/° C. Green sheets for these layers were superposed and press-formed to obtain a green body, which was then sintered to form an electrostatic holding apparatus. The thus-obtained electrostatic attraction portion has warping as small as 10 μm and no cracks, so that the electrostatic attraction portion can serve as an electrostatic holding apparatus.

Comparative Sample A in Table 1 shows the case where no thermal expansion mitigating layer was provided. In Comparative Sample A, the sintered body caused great warping, and cracks were generated around electrode patterns within the sintered body. Therefore, Comparative Sample A cannot be used as an electrostatic holding apparatus.

TABLE 1

| | Coefficient of thermal expansion (/20 C.) | | | Warping of attraction portion[1] (μm) | Generation of cracks in attraction portion |
|---|---|---|---|---|---|
| | Dielectric layer | Conductive layer | Thermal expansion mitigating layer | | |
| Invention Sample A | 7.8 × $10^{-6}$ | 8.6 × $10^{-6}$ | 8.2 × $10^{-6}$ | 10 | None |
| Comparative Sample A | 7.8 × $10^{-6}$ | 8.6 × $10^{-6}$ | Not provided | 650 | Generated at end portions of electrode patterns |

Note[1]: warping within a circular area (diameter: 200 mm) of the electrostatic attraction portion Further, a plurality of ceramic green sheets having different coefficients of thermal expansion were prepared for the thermal expansion mitigation layer, and each of these green sheets and other sheets for the other layers were processed in a similar manner to produce an electrostatic attraction portion. Table 2 shows results obtained through measurement and observation of the thus-produced electrostatic attraction portions.

TABLE 2

| | Coefficient of thermal expansion (/20 C.) | | | Warping of attraction portion[1] (μm) | Generation of (1) cracks and (2) inter-layer delamination |
|---|---|---|---|---|---|
| | Dielectric layer | Conductive layer | Thermal expansion mitigating layer | | |
| Invention Sample B | 7.8 × $10^{-6}$ | 8.6 × $10^{-6}$ | 8.2 × $10^{-6}$ | 8 | None |
| Invention Sample C | 7.8 × $10^{-6}$ | 8.6 × $10^{-6}$ | 8.0 × $10^{-6}$ | 15 | None |
| Invention Sample D | 7.8 × $10^{-6}$ | 8.6 × $10^{-6}$ | 7.9 × $10^{-6}$ | 18 | None |
| Comparative Sample B | 7.8 × $10^{-6}$ | 8.6 × $10^{-6}$ | 7.0 × $10^{-6}$ | 650 | (2) occurred |
| Comparative Sample C | 7.8 × $10^{-6}$ | 8.6 × $10^{-6}$ | 9.5 × $10^{-6}$ | 450 | (1) was generated at end portions of electrode patterns |
| Comparative Sample D | 7.8 × $10^{-6}$ | 8.6 × $10^{-6}$ | 7.4 × $10^{-6}$ | 210 | (2) occurred |

Note[1]: Warping within a circular area (diameter: 200 mm) of the electrostatic attraction portion The results shown in Table 2 demonstrate that good results are obtained when the coefficient of thermal expansion of the thermal expansion mitigating layer is greater than that of the insulating dielectric layer and that of the insulator layer but less than that of the conductive layer, and the coefficient of thermal expansion of the expansion mitigating layer is preferably an intermediate value halfway between the coefficient of thermal expansion of the insulating dielectric layer and the insulator layer and the coefficient of thermal expansion of the conductive layer. When the coefficient of thermal expansion of the thermal expansion mitigating layer falls within the above-described range, there can prevented generation of delamination at an interface between layers, generation of cracks around electrode patterns, and warping of and cracks in the sintered body.

Therefore, there can be produced an electrostatic attraction portion that generates a stronger electrostatic attraction force over the entire attraction surface, and that has an increased withstand voltage and excellent durability (Invention Samples B, C, and D in Table 2). By contrast, when the coefficient of thermal expansion of the thermal expansion mitigating layer is outside the above-described range, the differences in coefficient of thermal expansion between adjacent layers cannot be reduced sufficiently, so that the electrostatic attraction portion causes a great degree of warping, and cracks are generated due to stress. Further, defects such as inter-layer delamination and cracks are generated within the sintered body (Comparative Samples B, C, and D in Table 2).

The electrostatic force is generally represented by the following equation:

$$F = A \cdot \epsilon \cdot (V/t)^2$$

where F: electrostatic force (C), $\epsilon$: dielectric constant (F/m), V: applied voltage (V), t: thickness ($\mu$m), and A: constant.

Therefore, in order to increase the dielectric constant, ceramic powder having a high dielectric constant such as barium titanate, lead titanate, zirconium titanate, PLZT (lead zirconate titanate lantern), silica, or magnesia may be added, as an additional component, to the insulating dielectric layer, the insulator layer, and the thermal expansion mitigating layer in an amount that does not cause damage to semiconductor devices to be held.

An exemplary method for producing the electrostatic attraction portion 2 will be described. First, a binder and a solvent are mixed into ceramic powder to form green sheets for the insulting dielectric layer 4 and the insulator layer 5. Screen printing is then performed to print an electrode 3 on one surface of the green sheet for the insulating dielectric layer 4 through use of metal powder paste. Subsequently, a green sheet of a different composition and for the thermal expansion mitigating layer 6 is superposed on the green sheets, on which is further superposed a green sheet for the insulator layer 5. Subsequently, these green sheets are united through application of pressure by means of a high-pressure press, followed by sintering at a high temperature. Thus, a sintered body is obtained. Finally, opposite sides of the sintered body are precisely polished to obtain a plate-shaped electrostatic attraction portion 2.

Another exemplary method for producing the electrostatic attraction portion 2 will be described. First, a binder and a solvent are mixed into ceramic powder to form green sheets for the insulting dielectric layer 4 and the insulator layer 5. At this time, the green sheet for the insulting dielectric layer 4 is formed to be slightly larger than the insulator layer 5 in consideration of the thickness of the electrostatic attraction portion 2. Through use of metal powder paste, screen printing is then performed so as to print an electrode 3 on one surface of the green sheet for the insulating dielectric layer 4. Subsequently, a green sheet of a different composition and for the thermal expansion mitigating layer 6 is superposed on the green sheets, and the peripheral edges of the superposed layers are covered with the green sheet for the insulting dielectric layer 4. Further, a green sheet for the insulator layer 5 is superposed on the bottom surface. Subsequently, these green sheets are united through application of pressure by means of a high-pressure press, followed by sintering at a high temperature. Thus, a sintered body is obtained. Finally, opposite sides of the sintered body are precisely polished to obtain a plate-shaped electrostatic attraction portion 2.

Still another exemplary method for producing the electrostatic attraction portion 2 will be described. A metallic plate or conductive ceramic sheet is prepared as the electrode 3, ceramics for the thermal expansion mitigating layer 6 are thermal-sprayed on one surface thereof to a desired thickness, and ceramics for the insulating dielectric layer 4 are thermal-sprayed on both sides thereof to a desired thickness in order to form a plate shape, both sides of which are then polished accurately to complete the electrostatic attraction portion 2 (in this case, the insulating dielectric layer also serves as the insulator layer).

A screen printing method, a spraying and fusing method, a photo-lithography method, a plating method, or the like is used to form the conductive layer (electrode) 3. In order to form an attraction electric field, there may be used a monopolar-type electrode in which an object to be attracted is used as one electrode and the other electrode is placed within the electrostatic attraction portion 2, or a bipolar-type electrode in which two electrodes are placed within the electrostatic attraction portion 2.

Since voltage must be applied to the internal electrode 3 in order to generate an electrostatic force in the electrostatic attraction portion 2, holes communicating with the internal electrode 3 (hereinafter referred to as "electricity supply holes") are formed in the ceramic which covers the electrode, and lead wires are connected from the external power supply to the electrode 3. When the electrode is formed of a solderable material such as copper, platinum, or nickel-plated or gold-plated tungsten, the lead wires are soldered to the electrode through use of solder having a melting point higher than the operating temperature of the electrostatic chuck. When the electrode is formed of an insolderable material such as graphite, tungsten, or titanium nitride, threaded pins are formed of an alloy having a coefficient of thermal expansion equal to that of the ceramic, and the pins are inserted into the holes and silver-brazed to the electrodes.

Since the electrostatic attraction portion 2 has a thin plate-like shape and is easily broken, the plate portion 8 must serve as a reinforcing plate. Also, the plate portion 8 must have a high heat conductivity in order to effectively radiate heat and must have a small coefficient of thermal expansion so as not to impart distortion or warp to the electrostatic attraction portion 2. Therefore, the plate portion 8 is preferably formed of a material selected from the group of consisting of aluminum oxide, aluminum nitride, silicon nitride, silicon oxide, zirconium oxide, titanium oxide, sialon, boron nitride, and silicon carbide; or a mixed sintered material of two or more kinds of materials selected from the group. There can be used a laminated plate obtained through integration of the above ceramic plate and a metallic plate such as an Al plate, Cu plate, or Ti plate, or an alloy plate such as a stainless plate. Generally, a thermosetting synthetic resin adhesive having a high heat resistance is used for bonding between the electrostatic attraction portion 2 and the plate portion 8. If an adhesive that is in a liquid state at room temperature is used, the electrostatic attraction portion 2 and the plate portion 8 can be joined uniformly and easily, and adhesive bonding becomes usable regardless of the shapes of the electrostatic attraction portion 2 and the plate portion 8. Various application methods such as spin coating, bar coating, and spray coating may be used for application of the liquid adhesive.

EXAMPLES

The present invention will now be described by way of example. However, the present invention is not limited thereto.

Example 1

Butyral resin (8 parts by weight), ethanol (60 parts by weight), and dioctyl phthalate (12 parts by weight) were added to 100 parts by weight of a ceramic mixture of 92 wt. % alumina ($Al_2O_3$) powder, 2.0 wt. % magnesium oxide powder, and 6.0 wt. % silicon oxide powder, and the resultant mixture was then kneaded in a ball mill for 50 hours to yield slurry.

The slurry was then treated by a vacuum debubbling machine, and a fraction of the solvent was evaporated in order to adjust the viscosity to 30,000 cps. Then, a green sheet having a thickness of 0.7 mm was formed through use of a doctor blade, and two circular sheets having a diameter of 250 mm were cut from the green sheet. A bipolar electrode was printed on one circular sheet for the insulating dielectric layer by means of screen printing and through use of tungsten paste, such that concentric electrodes that constitute the bipolar electrode were formed with a spacing of 2.5 mm therebetween (the conductive layer formed of tungsten sintered body had a coefficient of thermal expansion of $8.6 \times 10^{-6}/°$ C.). Also, electricity supply holes each having a diameter of 2 mm were formed in the center portion of the other green sheet for the insulator layer. The holes were used as through holes for connecting the electrode and lead wires. Anther circular green sheet was separately prepared in the same manner as described above, and compressed under a pressure of 80 kg/cm² through use of a press heated to 100° C. Subsequently, the compressed sheet was sintered at 1650° C. in a mixed gas atmosphere containing 25 vol. % hydrogen and 75 vol. % nitrogen. The measured coefficient of thermal expansion of the sintered body was $7.8 \times 10^{-6}/°$ C.

Further, a green sheet for the thermal expansion mitigating layer was prepared as follows. Butyral resin (8 parts by weight), ethanol (60 parts by weight), and dioctyl phthalate (12 parts by weight) were added to 100 parts by weight of a ceramic mixture of 98 wt. % alumina powder, 0.5 wt. % magnesium oxide powder, and 1.5 wt. % silicon oxide powder, and the resultant mixture was then kneaded in a ball mill for 50 hours to yield slurry. The slurry was then treated by a vacuum debubbling machine, and a fraction of the solvent was evaporated in order to adjust the viscosity to 30,000 cps. Then, a green sheet having a thickness of 0.4 mm was formed through use of a doctor blade, and a circular sheet having a diameter of 250 mm was cut from the green sheet. Electricity supply holes each having a diameter of 2 mm were formed in the center portion of the other green sheet. Anther circular green sheet was separately prepared in the same manner as described above, and compressed under a pressure of 80 kg/cm² through use of a press heated to 100° C. Subsequently, the compressed sheet was sintered at 1650° C. in a mixed gas atmosphere containing 25 vol. % hydrogen and 75 vol. % nitrogen. The measured coefficient of thermal expansion of the sintered body was $8.4 \times 10^{-6}/°$ C.

Subsequently, the green sheet for the thermal expansion mitigating layer was superposed on the surface of the green sheet for the insulating dielectric layer, on which surface the electrode had been printed, and the green sheet for the insulator layer having the electricity supply holes was superposed thereon. Subsequently, through use of a press which had been heated to 100° C., a pressure of 80 kg/cm² was applied to the superposed sheets in order to unite the sheets. Subsequently, the united green body was sintered at a temperature of 1650° C. in an gas atmosphere containing 25 vol. % hydrogen and 75 vol. % nitrogen.

The amount of warping of the thus-obtained sintered body in a circular area having a diameter of 200 mm was measured by use of a three-dimensional measuring instrument. The measured warping was 8 μm. Subsequently, opposite surfaces of the resultant sintered body were polished in order to fabricate an electrostatic attraction portion having a thickness of 1.2 mm. Subsequently, portions of the tungsten electrodes exposed through the electricity supply holes were plated with nickel and gold, respectively, and two lead wires were soldered to these portions through use of a solder having a melting point of 350° C. Thus, an electrostatic holding apparatus was manufactured.

Next, a silicon wafer having a diameter of 8 inches was placed on the electrostatic holding apparatus, and a voltage of DC ±1 kV was applied between the two lead wires while the wafer was maintained at 0° C. In this state, the electrostatic force of the electrostatic holding apparatus was measured by use of an electrostatic force tester. The result of the measurement indicates that the electrostatic holding apparatus generates an electrostatic force of 1 kg/cm², which is sufficiently strong for straightening correction to improve the flatness of the wafer. When the applied voltage was shut off, the electrostatic holding apparatus quickly followed so that the wafer could be removed immediately after the stoppage of application of the voltage.

Example 2

An sintered body was produced in the same manner as in Example 1, except that for the thermal expansion mitigating layer, there was used 100 parts by weight of a ceramic mixture of 95 wt. % alumina powder, 2.0 wt. % magnesium oxide powder, and 3.0 wt. % silicon oxide powder. The coefficient of thermal expansion of the sintered body for the thermal expansion mitigating layer was measured. The measured coefficient of thermal expansion was $8.0 \times 10^{-6}/°$ C. In the sintered body for the electrostatic attraction portion fired through use of the green sheet for the thermal expansion mitigating layer, the amount of warping in a circular area having a diameter of 200 mm was 15 μm. Subsequently, opposite surfaces of the resultant sintered body were polished in order to fabricate an electrostatic attraction portion having a thickness of 1.2 mm, and two lead wires were soldered to produce an electrostatic holding apparatus.

Next, a silicon wafer having a diameter of 8 inches was placed on the electrostatic holding apparatus, and a voltage of DC ±1 kV was applied between the two lead wires while the wafer was maintained at 0° C. In this state, the electrostatic force of the electrostatic holding apparatus was measured by use of an electrostatic force tester. The result of the measurement indicates that the electrostatic holding apparatus generates an electrostatic force of 1 kg/cm², which is sufficiently strong for straightening correction to improve the flatness of the wafer. When the applied voltage was shut off, the electrostatic holding apparatus quickly followed so that the wafer could be removed immediately after the stoppage of application of the voltage.

Comparative Example 1

Butyral resin (8 parts by weight), ethanol (60 parts by weight), and dioctyl phthalate (12 parts by weight) were added to 100 parts by weight of a ceramic mixture of 92 wt. % alumina powder, 2.0 wt. % magnesium oxide powder, and 6.0 wt. % silicon oxide powder, and the resultant mixture was then kneaded in a ball mill for 50 hours to yield slurry.

The slurry was then treated by a vacuum debubbling machine, and a fraction of the solvent was evaporated in order to adjust the viscosity to 30,000 cps. Then, a green sheet having a thickness of 0.7 mm was formed through use of a doctor blade, and two circular sheets having a diameter of 250 mm were cut from the green sheet. A bipolar electrode was printed on one circular sheet by means of screen printing and through use of tungsten paste such that concentric electrodes that constitute the bipolar electrode were formed with a spacing of 2.5 mm therebetween. Also, electricity supply holes each having a diameter of 2 mm were formed in the center portion of the other green sheet for the insulator layer. Anther circular green sheet was cut and sintered. The measured coefficient of thermal expansion of the sintered body was 7.8×10$^{-6}$/° C.

Subsequently, the green sheet for the insulator layer was superposed on the surface of the green sheet on which the electrode had been printed, and through use of a press which had been heated to 100° C., a pressure of 80 kg/cm$^2$ was applied to the superposed sheets in order to unite the sheets. Subsequently, the united green body was sintered at a temperature of 1650° C. in a gas atmosphere containing 25 vol. % hydrogen and 75 vol. % nitrogen. The amount of warping of the thus-obtained sintered body in a circular area having a diameter of 200 mm was measured. The measured warping was 650 μm.

Subsequently, opposite surfaces of the resultant sintered body were polished in order to fabricate an electrostatic attraction portion having a thickness of 1.2 mm. Subsequently, portions of the tungsten electrodes exposed through the electricity supply holes were plated with nickel and gold, respectively, and two lead wires were soldered to these portions through use of a solder having a melting point of 350° C. Thus, an electrostatic holding apparatus was manufactured.

Next, a silicon wafer having a diameter of 8 inches was placed on the electrostatic holding apparatus, and a voltage of DC ±1 kV was applied between the two lead wires while the wafer was maintained at 0° C. In this state, the electrostatic force of the electrostatic holding apparatus was measured by use of an electrostatic force tester. Since inter-layer delamination occurred, the thickness of the dielectric layer changed across the electrostatic attraction surface. Especially, since dielectric breakdown occurred in the insulating dielectric layer itself at locations where the thickness decreased, a sufficient level of electrostatic attraction force could not be obtained.

Comparative Example 2

An sintered body was produced in the same manner as in Example 1, except that for the thermal expansion mitigating layer, there was used 100 parts by weight of a ceramic mixture of 90 wt. % alumina powder, 5.0 wt. % magnesium oxide powder, and 5.0 wt. % silicon oxide powder. The coefficient of thermal expansion of the sintered body for the thermal Jexpansion mitigating layer was measured. The measured coefficient of thermal expansion was 7.0×10$^{-6}$/° C. Subsequently, the amount of warping of the sintered body for the thermal expansion mitigating layer in a circular area having a diameter of 200 mm was 670 μm. In the sintered body for the electrostatic attraction portion fired through use of the green sheet for the thermal expansion mitigating layer, a - inter-layer delamination occurred in the internal conductive layer. Subsequently, opposite surfaces of the resultant sintered body were polished in order to fabricate an electrostatic attraction portion having a thickness of 1.2 mm, and two lead wires were soldered to produce an electrostatic holding apparatus.

Next, a silicon wafer having a diameter of 8 inches was placed on the electrostatic holding apparatus, and a voltage of DC ±1 kV was applied between the two lead wires while the wafer was maintained at 0° C. In this state, the electrostatic force of the electrostatic holding apparatus was measured by use of an electrostatic force tester. The thickness of the dielectric layer changed across the electrostatic attraction surface, and especially, dielectric breakdown occurred in the insulating dielectric layer itself at locations where the thickness decreased. Therefore, a sufficient level of electrostatic attraction force could not be obtained.

The present invention is not limited to the above-described embodiments. The above-described embodiments are mere examples, and those having the substantially same structure as that described in the appended claims and providing the similar action and effects are included in the scope of the present invention.

What is claimed is:

1. An electrostatic holding apparatus in which a voltage is applied to an electrode formed of a conductive layer disposed on an insulator layer and covered with an insulating dielectric layer in order to cause said insulating dielectric layer to electrostatically attract an object, wherein the electrostatic holding apparatus is formed of a sintered body in which a thermal expansion mitigating layer having a coefficient of thermal expansion between that of said conductive layer and that of said insulating dielectric layer and said insulator layer is disposed between said insulating dielectric layer and said conductive layer and/or between said conductive layer and said insulator layer, and directly joined to those layers; and said insulating dielectric layer, said conductive layer, said insulator layer, and said thermal expansion mitigating layer are superposed and press-formed in an unfired state to obtain a green body, which is then sintered to obtain the sintered body.

2. An electrostatic holding apparatus according to claim 1, wherein said thermal expansion mitigating layer is mainly formed of a ceramic material selected from the group consisting of aluminum nitride, aluminum oxide, silicon nitride, silicon oxide, zirconium oxide, titanium oxide, sialon, boron nitride, and silicon carbide, or a mixture of two or more kinds of ceramic materials selected from the group.

3. An electrostatic holding apparatus according to claim 1, wherein each of said insulating dielectric layer and said insulator layer is mainly formed of a ceramic material selected from the group consisting of aluminum nitride, aluminum oxide, silicon nitride, silicon oxide, zirconium oxide, titanium oxide, sialon, boron nitride, and silicon carbide, or a mixture of two or more kinds of ceramic materials selected from the group.

4. An electrostatic holding apparatus according to claim 2, wherein each of said insulating dielectric layer and said insulator layer is mainly formed of a ceramic material selected from the group consisting of aluminum nitride, aluminum oxide, silicon nitride, silicon oxide, zirconium oxide, titanium oxide, sialon, boron nitride, and silicon carbide, or a mixture of two or more kinds of ceramic materials selected from the group.

5. A method of producing an electrostatic holding apparatus in which a voltage is applied to an electrode formed of a conductive layer disposed on an insulator layer and covered with an insulating dielectric layer in order to cause said insulating dielectric layer to electrostatically attract an object, said method comprising the steps of:

superposing a green sheet for said insulator layer, a green sheet for said conductive electrode, a green sheet for said insulating dielectric layer, and at least one green sheet for a thermal expansion mitigating layer such that said thermal expansion mitigating layer having a coefficient of thermal expansion between that of said conductive layer and that of said insulating dielectric layer and said insulator layer is disposed between said insulating dielectric layer and said conductive layer and/or between said conductive layer and said insulator layer and direction joined to these layers;

press-forming said superposed layers to obtain a green body; and firing said green body to obtain a sintered body serving as said electrostatic holding apparatus.

6. A method of producing an electrostatic holding apparatus in which a voltage is applied to an electrode formed of a conductive layer disposed on an insulator layer and covered with an insulating dielectric layer in order to cause said insulating dielectric layer to electrostatically attract an object, said method comprising the steps of:

covering a green sheet for said conductive layer and a green sheet for a thermal expansion mitigating layer having a coefficient of thermal expansion between that of said conductive layer and that of said insulating dielectric layer and said insulator layer with a green sheet for said insulating dielectric layer;

superposing a green sheet for said insulator layer on the bottom surface of said green sheet for said thermal expansion mitigating layer;

press-forming the thus superposed green sheets to obtain a green body; and firing the green body to obtain a sintered body serving as said electrostatic holding apparatus.

* * * * *